(12) United States Patent
Mathieu et al.

(10) Patent No.: US 9,786,658 B2
(45) Date of Patent: Oct. 10, 2017

(54) FABRICATION METHOD OF A STACK OF ELECTRONIC DEVICES

(71) Applicant: COMMISSARIAT À L'ENERGIE ATOMIQUE ET AUX ENERGIES ALTERNATIVES, Paris (FR)

(72) Inventors: Benoit Mathieu, Grenoble (FR); Claire Fenouillet-Beranger, Voiron (FR)

(73) Assignee: COMMISSARIAT À L'ENERGIE ATOMIQUE ET AUX ENERGIES ALTERNATIVES, Paris (FR)

( * ) Notice: Subject to any disclaimer, the term of this patent is extended or adjusted under 35 U.S.C. 154(b) by 0 days.

(21) Appl. No.: 15/388,617

(22) Filed: Dec. 22, 2016

(65) Prior Publication Data

US 2017/0179114 A1 Jun. 22, 2017

(30) Foreign Application Priority Data

Dec. 22, 2015 (FR) ...................................... 15 63133

(51) Int. Cl.
*H01L 21/02* (2006.01)
*H01L 21/324* (2006.01)
(Continued)

(52) U.S. Cl.
CPC .... *H01L 27/0688* (2013.01); *H01L 21/02672* (2013.01); *H01L 21/02686* (2013.01);
(Continued)

(58) Field of Classification Search
CPC ....... H01L 21/02; H01L 21/06; H01L 21/324; H01L 21/02672; H01L 21/02686;
(Continued)

(56) References Cited

U.S. PATENT DOCUMENTS 8,241,942 B2 * 8/2012 Bourdelle ......... H01L 27/14689
257/E31.047
8,546,238 B2 * 10/2013 Tauzin .............. H01L 21/76254
257/E21.57
(Continued)

FOREIGN PATENT DOCUMENTS

EP    2 551 897 A1    1/2013
FR    2 898 430 A1    9/2007
(Continued)

OTHER PUBLICATIONS

Batude et al., "Symposium on VLSI Technology Advance Program", Digest of Technical Papaers, pp. 2-3, 2015.

*Primary Examiner* — Chuong A Luu
(74) *Attorney, Agent, or Firm* — Oliff PLC

(57) ABSTRACT

This method comprises the following steps: a) providing a first structure successively comprising a first substrate, a first electronic device, and a first dielectric layer; a second structure successively comprising a second substrate, an active layer, a second dielectric layer, and a polycrystalline semiconductor layer, the active layer being designed to form a second electronic device; b) bombarding the polycrystalline semiconductor layer by a beam of species configured to form an amorphous part and to preserve a superficial polycrystalline part; c) bonding the first and second structures; d) removing the second substrate of the second structure; e) introducing dopants into the amorphous part, through the exposed active layer; f) thermally activating the dopants by recrystallization of the amorphous part.

11 Claims, 3 Drawing Sheets

(51) Int. Cl.
  *H01L 27/06* (2006.01)
  *H01L 21/265* (2006.01)
  *H01L 23/00* (2006.01)

(52) U.S. Cl.
  CPC ...... *H01L 21/26506* (2013.01); *H01L 21/324* (2013.01); *H01L 24/83* (2013.01); *H01L 2224/29186* (2013.01); *H01L 2224/83005* (2013.01); *H01L 2224/83009* (2013.01); *H01L 2224/83379* (2013.01); *H01L 2224/83896* (2013.01); *H01L 2224/83948* (2013.01); *H01L 2924/01014* (2013.01); *H01L 2924/05442* (2013.01)

(58) Field of Classification Search
  CPC . H01L 21/26506; H01L 21/76; H01L 21/762; H01L 21/76251; H01L 21/76283; H01L 21/76254; H01L 21/18; H01L 21/30; H01L 21/46
  USPC .......................................................... 438/458
  See application file for complete search history.

(56) References Cited

U.S. PATENT DOCUMENTS

| | | | |
|---|---|---|---|
| 9,496,271 B2* | 11/2016 | Or-Bach | G11C 16/02 |
| 9,507,320 B2* | 11/2016 | Oliveira | B44C 1/17 |
| 2005/0082526 A1 | 4/2005 | Bedell et al. | |
| 2007/0210307 A1 | 9/2007 | Hebras | |
| 2010/0044706 A1 | 2/2010 | Hebras | |
| 2011/0201177 A1 | 8/2011 | Fournel et al. | |
| 2011/0284870 A1 | 11/2011 | Le Tiec et al. | |
| 2013/0099358 A1* | 4/2013 | Elolampi | H01L 23/13 257/618 |
| 2013/0341649 A1 | 12/2013 | Le Tiec et al. | |
| 2015/0061036 A1* | 3/2015 | Or-Bach | H03K 17/687 257/390 |
| 2015/0102471 A1 | 4/2015 | Colinge | |

FOREIGN PATENT DOCUMENTS

| | | |
|---|---|---|
| JP | S62-130519 A | 6/1987 |
| JP | 2000-091176 A | 3/2000 |
| WO | 2010/018204 A1 | 2/2010 |
| WO | 2010/049657 A1 | 5/2010 |

* cited by examiner

FABRICATION METHOD OF A STACK OF ELECTRONIC DEVICES

BACKGROUND OF THE INVENTION

The present invention relates to a fabrication method of a stack of electronic devices. As non-restrictive examples, an electronic device can be a transistor, a memory, a micro electromechanical system (MEMS) etc. An envisaged application is 3D Very-Large-Scale Integration (VLSI) by means of the CoolCube™ technology in order to successively fabricate transistors, the top transistors being fabricated at low temperature (typically less than 500° C.).

STATE OF THE ART

A known method of the state of the art comprises the following steps:
$a_0$) providing:
 a first structure successively comprising a first substrate, a first electronic device, and a first dielectric layer;
 a second structure successively comprising a second substrate, an active layer, a second dielectric layer, and a polycrystalline semiconductor layer, the active layer being designed to form a second electronic device;
$b_0$) bonding the first and second structures by direct bonding between the first dielectric layer and the polycrystalline semiconductor layer;
$c_0$) removing the second substrate of the second structure so as to expose the active layer;
$d_0$) adding dopants to the polycrystalline semiconductor layer, through the exposed active layer, so as to form a ground plane;
$e_0$) thermally activating the dopants added in step $d_0$).

Step $e_0$) of thermal activation of the dopants has to be executed with a thermal budget that does not impair the first electronic device. As a non-restrictive example, when the electronic device of the first structure is a planar transistor of Fully-Depleted Silicon on Insulator type (FDSOI) as described in the document by P. Batude et al., Symposium on VLSI Technology Advance Program, in Kyoto, Jun. 16-18, 2015, the maximum admissible thermal budget is about 500° C. for 5 h, 600° C. for 1 min, and 800° C. for 1 ms.

Step $e_0$) is important in order to obtain an efficient ground plane enabling for example modulation of the threshold voltage of a transistor and a reduction of the influence of short channel effects of a transistor.

It is known from the state of the art to execute step $e_0$) by:
 (i) amorphization of the ground plane formed in step $d_0$),
 (ii) followed by recrystallization of the ground plane at a temperature of less than 500° C., for a few minutes, so as to thermally activate the dopants.

Such a state-of-the-art method is not completely satisfactory in so far as step (i) of amorphization of the ground plane leads to a deep implantation through the active layer, the second dielectric layer and the ground plane. Furthermore, the ground plane presents a fairly small thickness (typically about 20 to 30 nm). This results in such an implantation being delicate and liable not to activate the dopants correctly, or to damage the surrounding layers of the ground plane, in particular the active layer, by amorphizing the latter.

SUMMARY OF THE INVENTION

Accordingly, the object of the present invention is to totally or partially remedy the above-mentioned shortcomings, and relates for this purpose to a fabrication method of a stack of electronic devices, comprising the following steps:
a) providing:
 a first structure successively comprising a first substrate, a first electronic device, and a first dielectric layer;
 a second structure successively comprising a second substrate, an active layer, a second dielectric layer, and a polycrystalline semiconductor layer, the active layer being designed to form a second electronic device;
b) bombarding the polycrystalline semiconductor layer with a beam of species configured to form an amorphous part and to preserve the superficial polycrystalline part;
c) bonding the first and second structures by direct bonding between the first dielectric layer and the superficial polycrystalline part;
d) removing the second substrate of the second structure so as to expose the active layer;
e) introducing dopants into the amorphous part through the exposed active layer so as to form a ground plane;
f) thermally activating the dopants introduced in step e) by recrystallization of the amorphous part.

Definitions

What is meant by "direct bonding" is bonding resulting from placing two surfaces in direct contact, i.e. in the absence of an additional element such as a glue, a wax or a brazing. The bonding is mainly caused by the Van der Waals forces originating from the electronic interaction between the atoms or molecules of two surfaces. This can also be referred to as bonding by molecular adhesion.

What is meant by "amorphous" is that the part presents a mass degree of crystallinity of less than 20%.

What is meant by "polycrystalline" is that the part presents a mass degree of crystallinity comprised between 20% and 80%.

What is meant by "configured to" is that the bombardment parameters (mainly the energy, dose, and angle of attack) and the treatment parameters (mainly the duration of the operation, temperature and pressure) are chosen according to the nature of the species to form an amorphous part and to preserve a superficial polycrystalline part.

What is meant by "dielectric" is that the layer presents an electric conductivity at 300 K of less than $10^{-8}$ S/cm.

What is meant by "semiconductor" is that the layer presents an electric conductivity at 300 K comprised between $10^{-8}$ and $10^{3}$ S/cm.

What is meant by "thermal budget" is the choice of an annealing temperature value and the choice of an anneal time value.

Accordingly, such a method according to the invention enables the dopants to be thermally activated in step f), with a reduced thermal budget as compared with the state of the art, while at the same time circumventing deep implantation for amorphization by means of step b).

Indeed, on the one hand preserving a superficial polycrystalline part in step b) enables:
 both the recrystallization thermal budget to be reduced in step f) so as not to impair the first electronic device;
 and a main crystallization direction (vertical) to be imposed so as to prevent random crystallization and to improve the quality and efficiency of the ground plane.

On the other hand, there is no deep implantation for amorphization of the ground plane as bombardment step b) is performed before bonding step c), on the polycrystalline semiconductor layer, which is a superficial layer of the second structure. Furthermore, the active layer is protected from bombardment by the second dielectric layer.

Advantageously, step b) is executed so that the preserved superficial polycrystalline part forms a continuous film.

Advantageously, step b) is executed so that the preserved superficial polycrystalline part presents a suitable thickness to form a polycrystalline seed, the thickness preferably being comprised between 2 nm and 4 nm.

Preferentially, the species of the beam are silicon atoms.

Advantageously, step f) is performed with a pulsed laser.

It is thus possible to apply a thermal budget for recrystallization with an annealing temperature much higher than 500° C. (for example 1000-1200° C.) for a very short anneal time (about 20 to 200 nanoseconds). In particular, to recrystallize amorphous Si in a single pulse, the annealing temperature has to be higher than 1100° C., or even higher than 1200° C.

According to an alternative, step f) is performed by applying a thermal anneal presenting:
an annealing temperature value less than or equal to 600° C.,
an anneal time value less than or equal to 1 min.

Advantageously, step e) is performed so as not to recrystallize the amorphous part.

Thus, introduction of the dopants results neither in recrystallization of the amorphous part nor in destruction of the superficial polycrystalline part, which enables a subsequent recrystallization concomitant with thermal activation of the dopants. Thermal activation of the dopants in step f) is however of better quality when it is performed in concomitant manner with the thermal recrystallization annealing.

Preferentially, the polycrystalline semiconductor layer is silicon-based.

Advantageously, the first dielectric layer is silicon dioxide-based and presents a thickness of more than 60 nm, preferably more than 80 nm.

Such a first dielectric layer thus enables a satisfactory thermal insulation of the first electronic device to be obtained.

Preferentially, the dopants introduced in step e) are selected from the group comprising B, In, P, and As.

Advantageously, the method comprises a step consisting in forming an oxide layer on the superficial polycrystalline part before step c), direct bonding taking place between the first dielectric layer and the oxide layer.

Such an oxide layer thus enables hydrophilic bonding to be obtained in step c)
the first dielectric layer preferentially being an oxide—with a sufficiently high bonding energy to remove the second substrate in step d) without any risk of breaking the bonding interface.

BRIEF DESCRIPTION OF THE DRAWINGS

Other features and advantages will become apparent from the following description of different embodiments of the invention, given for non-restrictive example purposes only, with reference to the appended drawings in which.

DETAILED DESCRIPTION OF THE EMBODIMENTS

Figure 1:
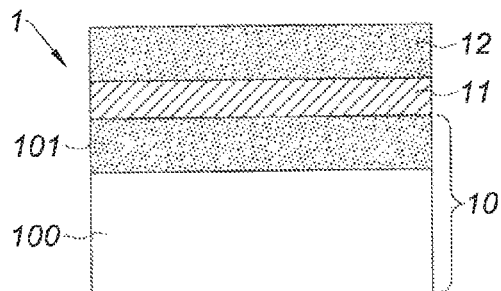
FIGS. 1 to 6 are schematic cross-sectional views of an embodiment of the invention.
Figure 2:
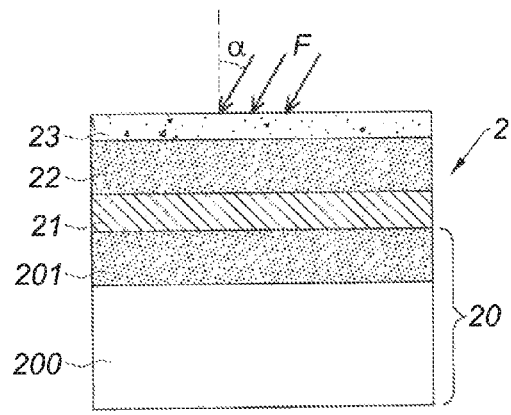
Figure 4:
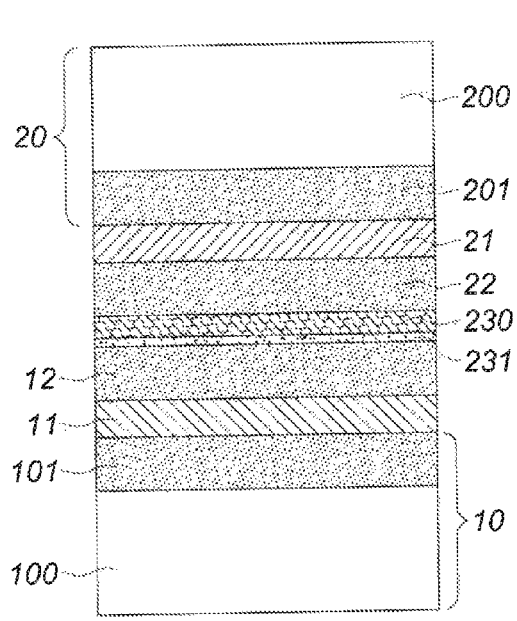
Figure 3:
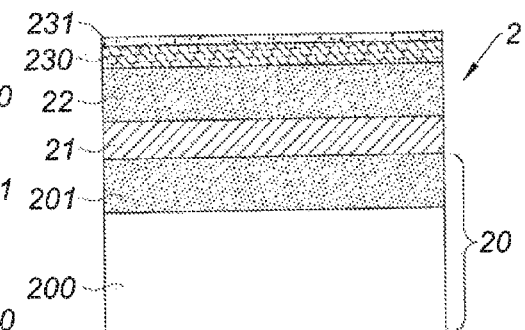
Figures 5, 6:
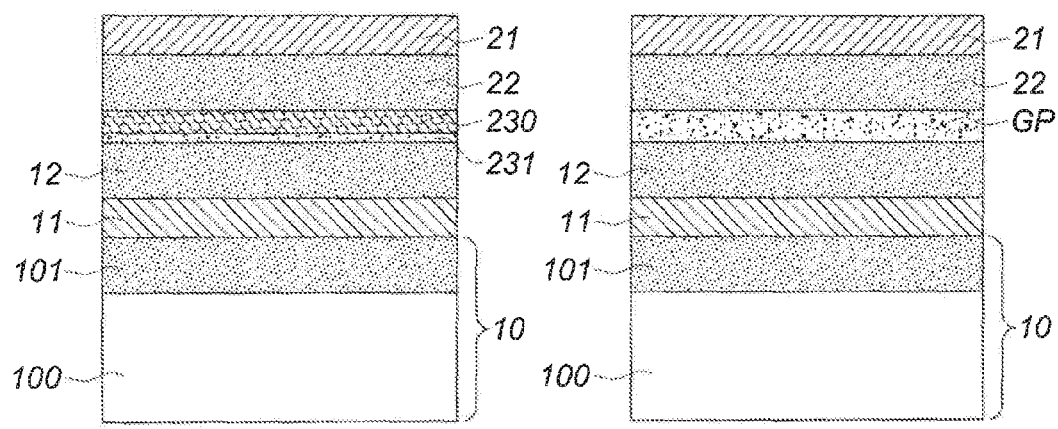

For the different embodiments, the same reference numerals will be used for parts that are identical or which perform the same function, for the sake of simplification of the description. The technical features described in the following for different embodiments are to be considered either alone or in any technically possible combination.

The method illustrated in FIGS. 1 to 6 is a fabrication method of a stack of electronic devices 11, 21, comprising the following steps:
a) providing:
    a first structure 1 (illustrated in the FIG. 1) successively comprising a first substrate 10, a first electronic device 11, and a first dielectric layer 12;
    a second structure 2 (illustrated in FIG. 2) successively comprising a second substrate 20, an active layer 21, a second dielectric layer 22, and a polycrystalline semiconductor layer 23, the active layer 21 being designed to form a second electronic device;
b) bombarding the polycrystalline semiconductor layer 23 by a beam F of species configured to form an amorphous part 230 and to preserve a superficial polycrystalline part 231 (step illustrated in FIGS. 2 and 3);
c) bonding the first and second structures 1, 2 by direct bonding between the first dielectric layer 12 and the superficial polycrystalline part 231 (step illustrated in FIG. 4);
d) removing the second substrate 20 of the second structure 2 so as to expose the active layer 21 (step illustrated in FIG. 5);
e) introducing dopants into the amorphous part 230, through the exposed active layer 21, so as to form a ground plane GP (step illustrated in FIG. 6);
f) thermally activating the dopants introduced in step e) by recrystallization of the amorphous part 230.

First Structure

The first substrate 10 advantageously comprises a support substrate 100 on which a dielectric layer 101 is formed. For non-restrictive example purposes, the support substrate 100 is silicon-based and the dielectric layer 101 is silicon dioxide-based.

The first dielectric layer 12 forms an intermediate layer between the two electronic devices 11, 21. The first dielectric layer 12 preferentially presents a thickness of more than 60 nm, more preferentially more than 80 nm. The first dielectric layer 12 is preferentially silicon dioxide-based.

Figure 9:
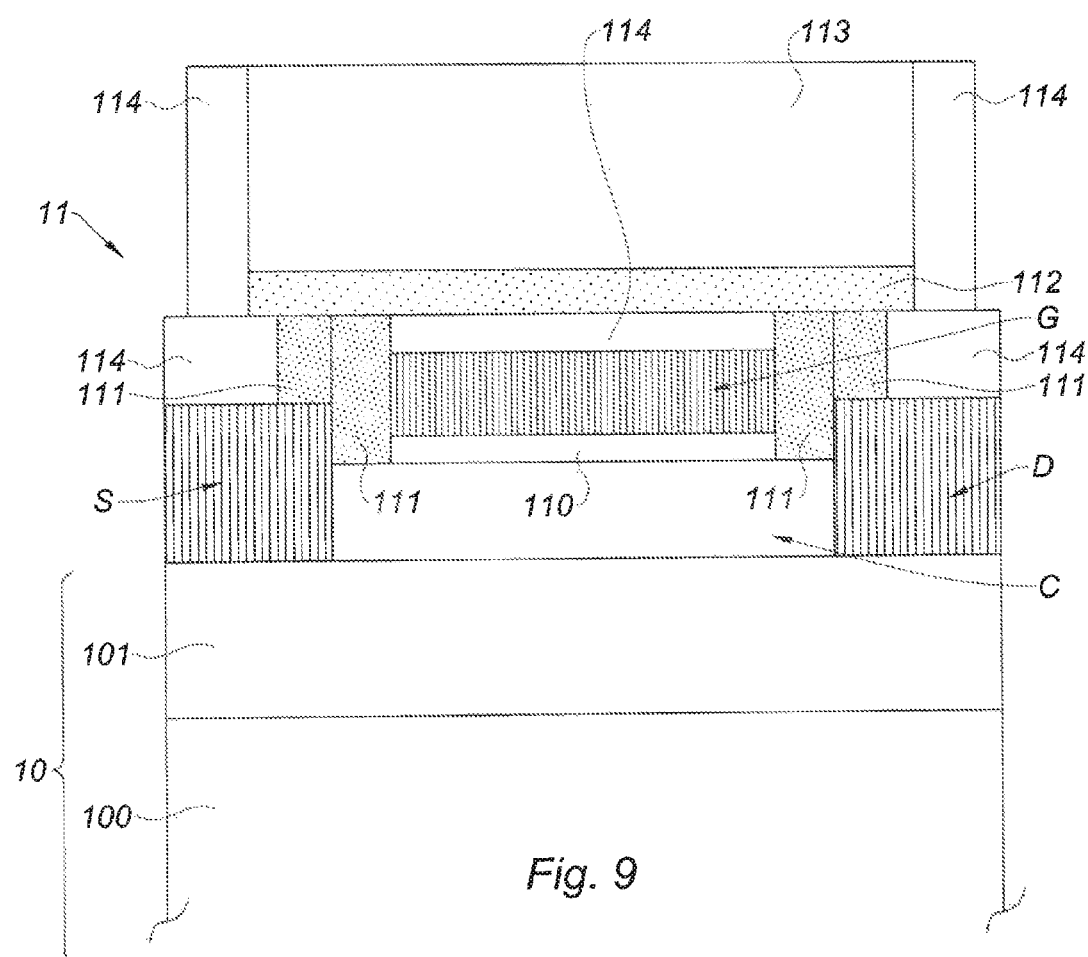
FIG. 9 is a schematic cross-sectional view illustrating an electronic device of transistor type able to belong to a lower level for VLSI.

For non-restrictive example purposes, the first electronic device 11 illustrated in FIG. 9 is a MOSFET (MOSFET standing for metal oxide semiconductor field effect transistor). The electronic device 11 of the first structure 1 comprises:
a source S, a drain D, and a gate G forming the electrodes of the transistor,
contacts 114 extending from said electrodes,
a channel C,
a gate oxide layer 110 separating channel C from gate G,
spacers 111 made from dielectric material (for example SiN), arranged on each side of the gate G to separate gate G from source S and drain D, in order to prevent short-circuiting,
a nitride layer 112 and an oxide layer 113 extending above gate G and spacers 111 so as to prevent short-circuiting of the contacts 114.

The first electronic device 11 advantageously comprises interconnection levels (not illustrated) between the oxide layer 113 and dielectric layer 12.

Second Structure

The second substrate 20 advantageously comprises a support substrate 200 on which a dielectric layer 201 is formed. For non-restrictive example purposes, the support substrate 200 is silicon-based and the dielectric layer 201 is silicon dioxide-based. The dielectric layer 201 advantageously forms an etch stop layer in step d).

The second structure 2 can be a substrate of SOI (Silicon-on-Insulator) type on which the second dielectric layer 22 is formed by thermal oxidation or deposition.

According to a variant, the second substrate 20 can comprise a weakened area delineating a first part and a second part of the second substrate 20. The first part of the second substrate 20 forms a support substrate 200. The second part of the second substrate 20 is designed to form the active layer 21. The weakened area is preferentially obtained by implantation of species, for example hydrogen. The implantation parameters, essentially the dose and energy, are determined according to the nature of the species and of the second substrate 20.

The second dielectric layer 22 forms an intermediate layer between the two electronic devices 11, 21. The second dielectric layer 22 of the second structure 2 advantageously presents a thickness comprised between 10 nm and 30 nm. The active layer 21 advantageously presents a thickness comprised between 5 nm and 40 nm. As a non-restrictive example, the active layer 21 is silicon-based and the second dielectric layer 22 is silicon dioxide-based.

Polycrystalline Semiconductor Layer

The polycrystalline semiconductor layer 23 is preferentially silicon-based. The polycrystalline semiconductor layer 23 is preferentially deposited on the second dielectric layer 22 by Physical Vapor Deposition (PVD) or by Chemical Vapor Deposition (CVD). The polycrystalline semiconductor layer 23 preferentially presents a thickness comprised between 20 nm and 30 nm.

Bombardment

Step b) is advantageously executed in such a way that the preserved superficial polycrystalline part 231 forms a continuous film. Step b) is advantageously executed in such a way that the preserved superficial polycrystalline part 231 presents a suitable thickness to form a polycrystalline seed, the thickness preferably being comprised between 2 nm and 4 nm.

The species of the beam F are preferentially silicon atoms. The person skilled in the art is able to adjust the experimental bombardment parameters in order to form an amorphous part 230 and to preserve a superficial polycrystalline part 231. For example purposes, when the polycrystalline semiconductor layer 23 is silicon-based with a thickness of about 20 nm, and when the species of the beam F are silicon atoms, the following parameters enable an amorphous part 230 to be formed and a superficial polycrystalline part 231 to be preserved:

- a dose of $1.5 \times 10^{14}$ at.cm$^{-2}$,
- an energy of 12 keV,
- a dose rate of $10^{13}$ at.cm$^{-2}$.s$^{-1}$,
- an angle of attack α of 15° with respect to the perpendicular o the polycrystalline semiconductor layer 23, and
- a temperature of 20° C.

Bonding

The method can comprise a step consisting in forming an oxide layer on the superficial polycrystalline part 231 before step c), direct bonding taking place between the first dielectric layer 12 and the oxide layer.

Step c) can comprise a prior step consisting in planarizing the surface of the first dielectric layer 12 and/or the surface of the superficial polycrystalline part 231. This prior step is for example formed by means of Chemical Mechanical Polishing (CMP).

Removal of the Second Substrate

Step d) preferentially comprises a grinding step of the support substrate 200 followed by an etching step of the remaining part of the support substrate 200, for example with tetramethylammonium hydroxide (TMAH). Finally, the dielectric layer 201 is etched, preferentially by a wet etching process.

When the second substrate 20 comprises a weakened area, step d) is executed by fracturing the second substrate 20 along the weakened area so as to expose the active layer 21.

Ground Plane

The ground plane GP is formed from the doped amorphous part 230.

The dopants introduced into the amorphous part 230 in step e) preferentially comprise:

- p-type dopants such as boron or indium, and
- n-type dopants such as phosphorus or arsenic.

The p-type and n-type dopants advantageously present a concentration comprised between 2 and $5 \times 10^{18}$ cm$^{-3}$.

Step e) is preferentially performed by ion implantation. For example, for phosphorus, the dose is about $10^{13}$ cm$^{-2}$, the energy is about 25-35 keV and the angle of attack is 15°. For boron, the dose is about $10^{13}$ cm$^{-2}$, the energy is about 15 keV and the angle of attack is 15°. For indium, the dose is about $10^{13}$ cm$^{-2}$, the energy is about 80 keV and the angle of attack is zero. Such parameters enable amorphization of the active layer 21 to be prevented.

Step e) is advantageously performed in such a way as not to recrystallize the amorphous part 230. To do this, the dose rate and implantation temperature are chosen such as not to recrystallize the amorphous 230. For example purposes, a dose rate of about $10^{14}$ at.cm$^{-2}$.s$^{-1}$ and an implantation temperature of less than 100° C. enable recrystallization of the amorphous part 230 to be prevented.

Advantageously, step e) previously comprises photolithography and etching steps in the stack comprising the polycrystalline part 231, amorphous part 230, second dielectric layer 22 and active layer 21. The photolithography and etching steps preferentially consist in forming first and second patterns in said stack. It is then possible to introduce p-type dopants in the amorphous part 230 of the first patterns and n-type dopants in the amorphous part 230 of the second patterns. The ground plane GP formed on completion of step e) then comprises p-doped areas and n-doped areas.

Thermal Activation of the Dopants

According to a first embodiment, step f) is executed by applying thermal annealing presenting a suitable thermal budget so as not to impair the first electronic device 11. As a non-restrictive example, it is possible to thermally activate boron atoms when their concentration is about $10^{18}$ cm$^{-3}$, with an annealing temperature of 600° C. for an anneal time of one minute.

Figure 7:
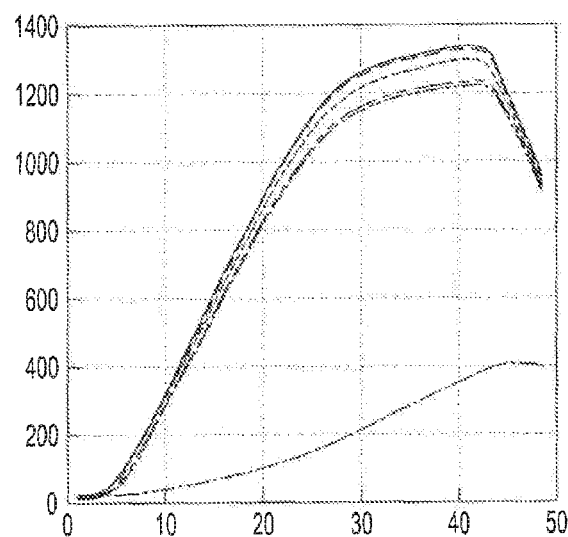
FIG. 7 is a graph representing the duration of the laser pulses (in ns) on the x-axis and the temperature (in ° C.) simulated at interfaces of layers, noted T1 to T6, on the y-axis.
Figure 8:
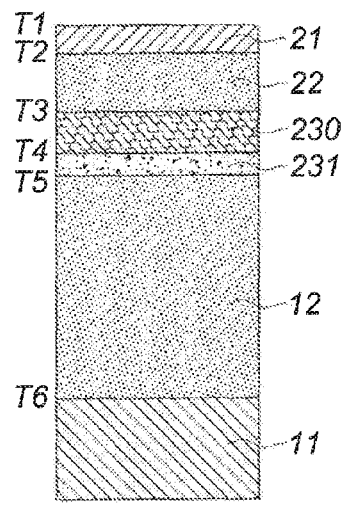
FIG. 8 is a schematic cross-sectional view of layers belonging to the first and second structures, the temperature of which is simulated in FIG. 7.

According to a second embodiment, step f) is executed with a pulsed laser. The wavelength of the laser is chosen for its selectivity, i.e. the active layer 21 and second dielectric layer 22 have to be transparent at this wavelength, whereas the amorphous part 230 has to be absorbent at this wavelength. As a non-restrictive example, when the active layer 21 is silicon-based, when the second dielectric layer 22 is silicon dioxide-based, and when the amorphous part 230 is amorphous silicon-based, a laser wavelength comprised between 530 nm and 540 nm is selective. Furthermore, the fluence of the laser (about one $J \cdot cm^{-2}$) and the pulse time (about 20 ns to 200 ns) are adjusted to the thicknesses of the active layer 21 and of the second dielectric layer 22 in order to reach and thermally activate the dopants introduced into the amorphous part 230, without damaging the first electronic device 11. As a non-restrictive example illustrated in FIGS. 7 and 8, for a wavelength of 532 nm, when the active layer 21 and second dielectric layer 22 respectively present a thickness of 10 nm and 20 nm, a fluence of 0.13 $J \cdot cm^{-2}$ and a pulse time of 43 ns then enable the dopants introduced into the amorphous part 230 to be reached and thermally activated (over a thickness of 20 nm), without damaging the first electronic device 11 (the thickness of the intermediate first dielectric layer 12 being equal to 120 nm). As illustrated in FIG. 7, for a pulse time of 43 ns:

the temperature T3 is more than 1200° C. in the amorphous part 230, which enables the silicon to be recrystallized;

the temperature T1 is lower than 1400° C., which prevents melting of the active layer 21;

the temperature T6 in the first electronic device 11 remains lower than 400° C., The above-mentioned fluence and pulse time values are the result of simulations. Naturally, the corresponding experimental values are liable to differ, for example by up to 15%.

If the active layer 21 is covered by an oxide layer or if the thickness of the active layer 21 is increased, one possibility of adjustment of the parameters is an increase of the laser fluence.

Interconnections Stack Levels

Naturally, the first structure 1 can be provided with a set of first electronic devices 11 extending over the substrate 10. The first electronic devices 11 of the set are advantageously interconnected by metallic lines.

Furthermore, the present invention is not limited to two stack levels of electronic devices 11, 21. It is quite possible to envisage at least a third stack level by reiterating the steps of the method after formation of the second electronic device from the active layer 21.

The invention claimed is:

1. Fabrication method of a stack of electronic devices, comprising the following steps:
   a) providing:
      a first structure successively comprising a first substrate, a first electronic device, and a first dielectric layer;
      a second structure successively comprising a second substrate, an active layer, a second dielectric layer, and a polycrystalline semiconductor layer, the active layer being designed to form a second electronic device;
   b) bombarding the polycrystalline semiconductor layer by a beam of species so as to form an amorphous part and to preserve a superficial polycrystalline part;
   c) bonding the first and second structures by direct bonding between the first dielectric layer and the superficial polycrystalline part;
   d) removing the second substrate of the second structure so as to expose the active layer;
   e) introducing dopants into the amorphous part, through the exposed active layer so as to form a ground plane;
   f) thermally activating the dopants introduced in step e) by recrystallization of the amorphous part.

2. Method according to claim 1, wherein step b) is executed in such a way that the preserved superficial polycrystalline part forms a continuous film.

3. Method according to claim 1, wherein step b) is executed in such a way that the preserved superficial polycrystalline part presents a suitable thickness to form a polycrystalline seed, the thickness preferably being comprised between 2 nm and 4 nm.

4. Method according to claim 1, wherein the species of the beam are silicon atoms.

5. Method according to claim 1, wherein step f) is executed with a pulsed laser.

6. Method according to claim 1, wherein step f) is executed by applying a thermal annealing presenting:
   an annealing temperature value lower than or equal to 600° C.
   an anneal time value lower than or equal to 1 min.

7. Method according to claim 1, wherein step e) is executed so as not to recrystallize the amorphous part.

8. Method according to claim 1, wherein the polycrystalline semiconductor layer is silicon-based.

9. Method according to claim 1, wherein the first dielectric layer is silicon dioxide-based, and presents a thickness of more than 60 nm, preferably more than 80 nm.

10. Method according to claim 1, wherein the dopants introduced in step e) are selected from the group comprising B, In, P, and As.

11. Method according to claim 1, comprising a step consisting in forming an oxide layer on the superficial polycrystalline part before step c), direct bonding taking place between the first dielectric layer and the oxide layer.

* * * * *